United States Patent
Lin et al.

(10) Patent No.: US 7,158,065 B2
(45) Date of Patent: Jan. 2, 2007

(54) SIGNAL DRIVING CIRCUITS

(75) Inventors: Ching-Wei Lin, Chunan (TW);
Chueh-Kuei Jan, Chunan (TW);
Meng-Hsun Hsieh, Chunan (TW)

(73) Assignee: TPO Displays Corp., Chu-Nan (TW)

( * ) Notice: Subject to any disclaimer, the term of this patent is extended or adjusted under 35 U.S.C. 154(b) by 0 days.

(21) Appl. No.: 11/216,954

(22) Filed: Aug. 30, 2005

(65) Prior Publication Data
US 2006/0176200 A1    Aug. 10, 2006

Related U.S. Application Data

(60) Provisional application No. 60/649,617, filed on Feb. 4, 2005.

(51) Int. Cl.
*H03M 1/66* (2006.01)

(52) U.S. Cl. .................................. 341/144; 345/99

(58) Field of Classification Search ............... 341/144, 341/154; 345/99, 208, 691, 692, 693
See application file for complete search history.

(56) References Cited

U.S. PATENT DOCUMENTS

| 6,556,162 B1 * | 4/2003 | Brownlow et al. ......... 341/145 |
| 6,747,626 B1 * | 6/2004 | Chiang ...................... 345/98 |
| 6,876,235 B1 | 4/2005 | Li et al. |
| 6,919,743 B1 | 7/2005 | Tobita |
| 7,075,342 B1 | 7/2006 | Nishimura |

OTHER PUBLICATIONS

Y. Kida, et al., "LN-4: A 3.8 inch Half-VGA Transflective Color TFT-LCD with Completely Integrated 6-bit RGB Parallel Interface Drivers", EURODISPLAY 2002, pp. 831-834, no month.

* cited by examiner

*Primary Examiner*—Howard L. Williams
(74) *Attorney, Agent, or Firm*—Liu & Liu (57) ABSTRACT

Signal driving circuits with high driving capability and precise analog output voltage level, by outputting analog voltages through analog buffers and directly outputting voltages from digital-to-analog converters in turn. A digital-to-analog converter generates a first analog voltage according to digital data. An output circuit selectively either outputs a second analog voltage according to the first analog voltage by an analog buffer to a load or outputs the first analog voltage to the load directly.

20 Claims, 11 Drawing Sheets

great text volume.

SIGNAL DRIVING CIRCUITS

BACKGROUND

The invention relates to driving circuits, and more particularly, to signal driving circuits with a precise output analog voltage level and high driving capability.

Figure 8A:
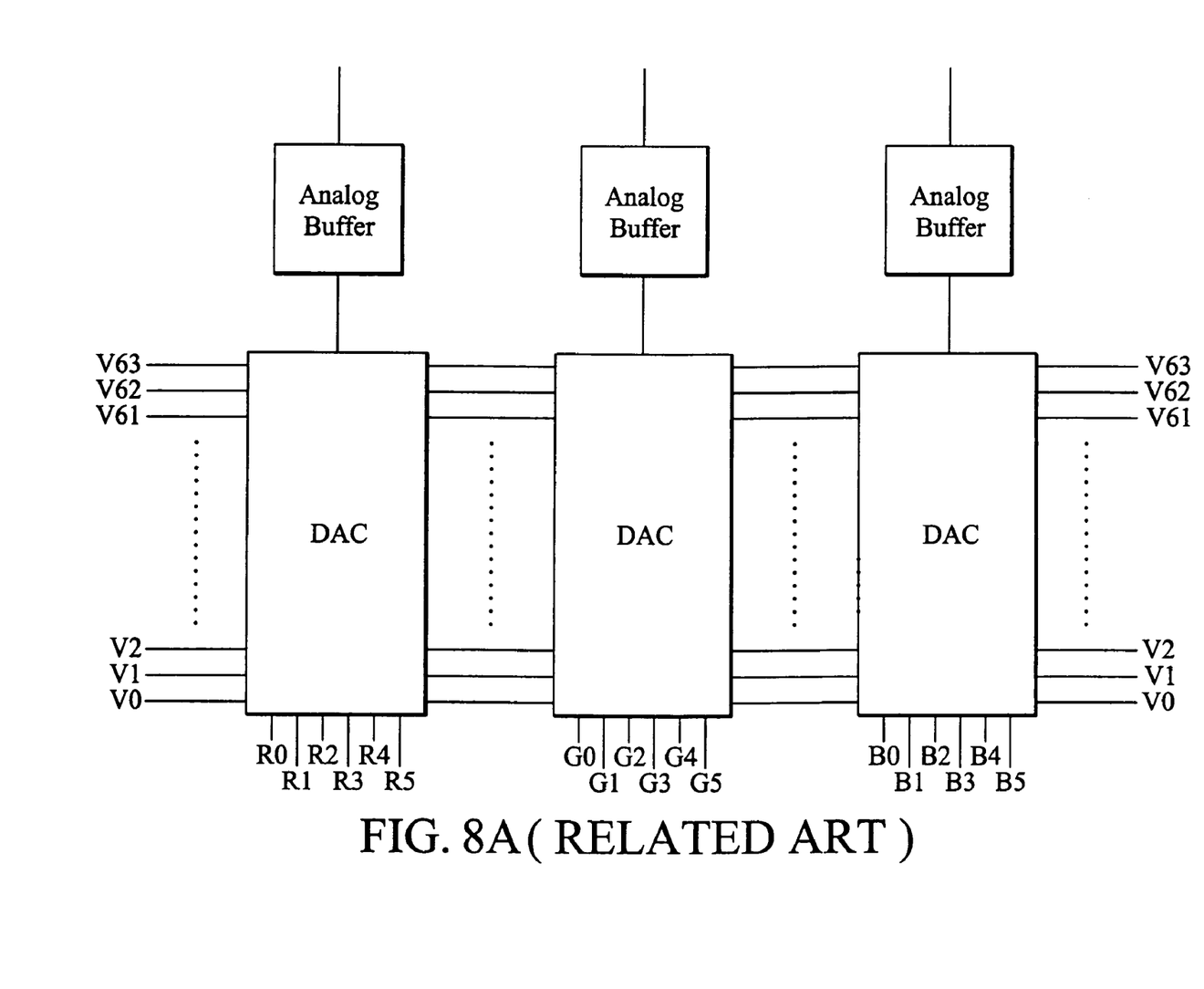
FIG. 8A shows digital-to-analog converters connected to analog buffers in a conventional driving circuit.
Figure 8B:
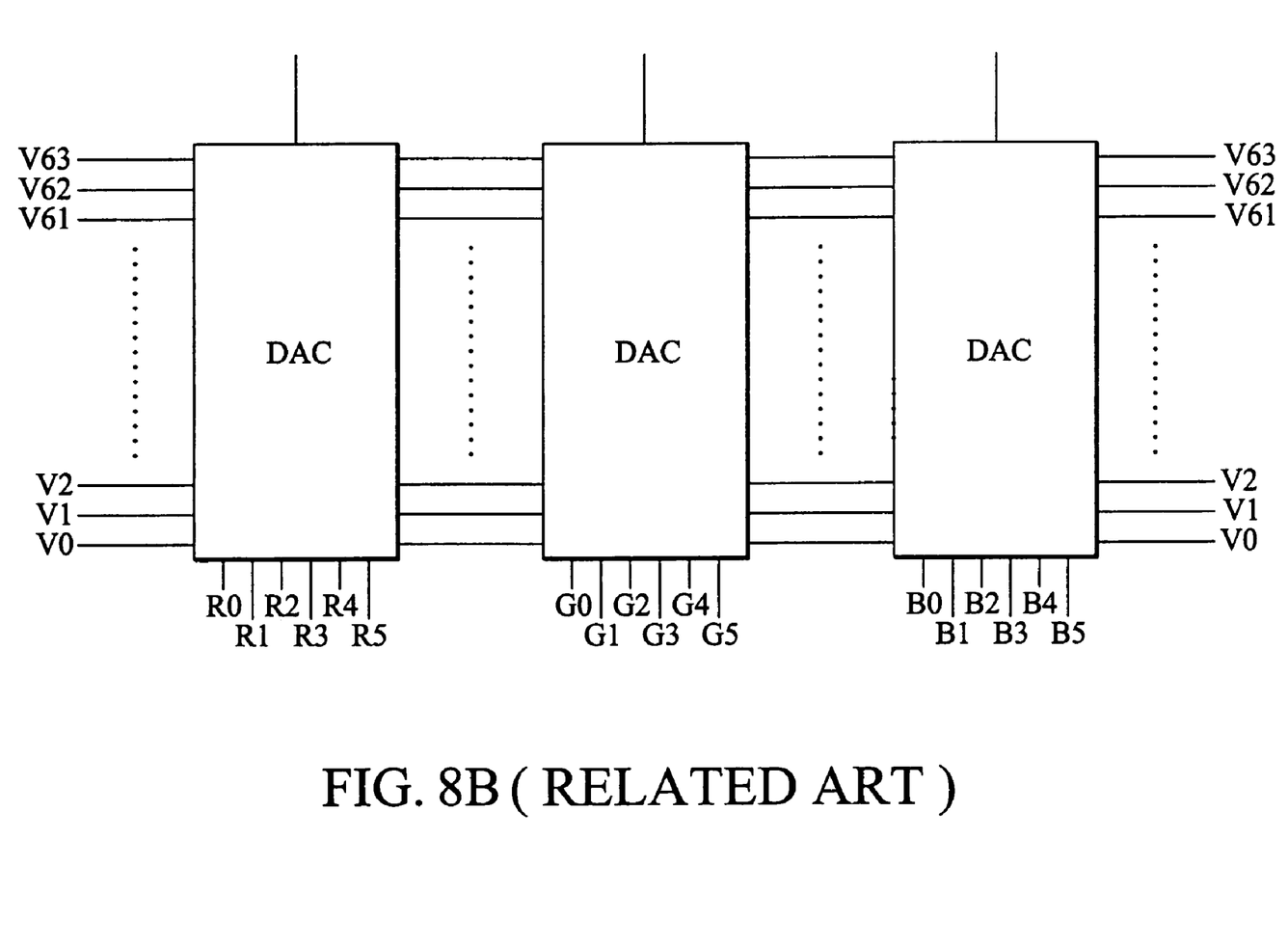
FIG. 8B shows digital-to-analog converters without analog buffer in a conventional driving circuit.

To reduce total module costs and time-to-market of display systems, "system-on-glass" technology of low temperature poly-Si (LTPS) TFTs offers a promising solution due to integration of driving circuit on glass. In conventional display systems, digital-to-analog conversion is the most important part of a signal driving circuit, such as a source/data driver. Typically, a digital-to-analog converter (DAC) requires a unit-gain analog buffer to improve driving capability thereof, as shown in FIG. 8A. However, because TFTs have poor performance, such as poor uniformity and high driving voltage, analog buffers composed of TFTs always have a large DC offset voltage, resulting in large difference between input and output analog voltage levels. If there is no analog buffer at the output of the DAC (as shown in FIG. 8B), either the driving capability of the DAC is insufficient or the power consumption of R-string voltage reference circuit is high when the DAC is a resistive DAC (R-DAC).

SUMMARY

The invention is directed to the broad concept of providing a signal driving circuit that selectively outputs a first analog voltage from a digital-to-analog converter without passing through an analog buffer, or a second analog voltage by an analog buffer according to the first analog voltage, to reduce DC offset, so as to obtain a precise output analog voltage level.

In another aspect, the present invention discloses embodiments of a driving circuit, in which a digital-to-analog converter (DAC) generates a first analog voltage according to digital data, and an output circuit selectively outputs either a second analog voltage, according to the first analog voltage, by an analog buffer or the first analog voltage to the load without passing through an analog buffer.

In a further aspect, the present invention discloses embodiments of a driving circuit, in which a first DAC generates a first analog voltage according to a first digital data and a first set of voltage levels, a first output circuit selectively outputs a second analog voltage by a first analog buffer according to the first analog voltage to a first load or the first analog voltage to the first load without passing through an analog buffer, a second DAC generates a third analog voltage according to a second digital data and a second set of voltage levels, and a second output circuit selectively outputs a fourth analog voltage by a second analog buffer according to the third analog voltage to a second load or the third analog voltage to the second load without passing through an analog buffer.

In another aspect, the present invention discloses embodiments of an electronic device, in which a signal driving circuit mentioned above and a display element are coupled to the signal driving circuit, wherein the display element is driven by the signal driving circuit.

DESCRIPTION OF THE DRAWINGS

The invention can be more fully understood by the subsequent detailed description and examples with reference made to the accompanying drawings, wherein.

DETAILED DESCRIPTION

Figure 1A:
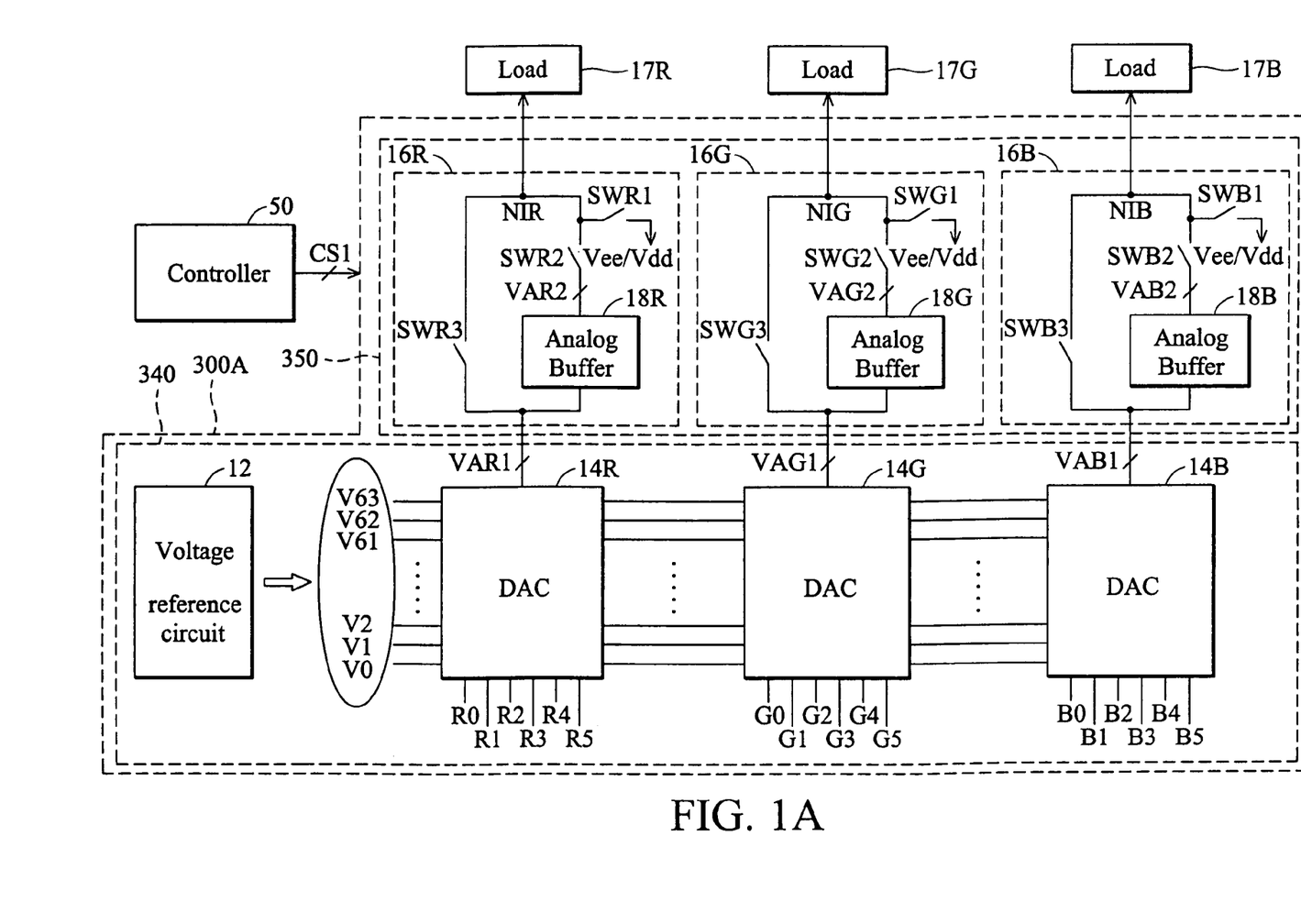
FIG. 1A shows an embodiment of a signal driving circuit of the invention.

FIG. 1A shows an embodiment of a signal driving circuit in accordance with one aspect of the present invention. The signal driving circuit 300A comprises a voltage reference circuit 12, three digital-to-analog converters (DACs) 14R, 14G and 14B, and three output circuits 16R, 16G and 16B. The signal driving circuit 300A can be a portion of a source driver or a data driver in a display system, such as a liquid crystal display system or the like.

As shown in FIG. 1A, the DACs 14R, 14G and 14B are coupled to the analog reference voltage levels V0, V1, . . . , V61, V62 and V63 provided from the voltage reference circuit 12. In this case, the three DACs can be resistive DACs and the voltage reference circuit 12 can be a resistor string (R-string). The DAC 14R is coupled to the reference voltage levels V0~V63 and digital data R0~R5 and generates an analog voltage VAR1 to the output circuit 16R according thereto. The DAC 14G is coupled to reference voltage levels V0~V63 and digital data G0~G5 and generates an analog voltage VAG1 to the output circuit 16G according thereto. The DAC 14B is coupled to the reference voltage levels V0~V63 and digital data B0~B5 and generates analog voltage VAB1 to the output circuit 16B according thereto.

The output circuits 16R, 16G and 16B are coupled between the DACs 14R, 14G and 14B and corresponding loads 17R, 17G and 17B, and output voltages to the corresponding loads according to the analog voltage VAR1, VAG1 and VAB1. The output circuit 16R comprises three switching devices SWR1~SWR3, and an analog buffer 18R. The switching device SWR1 is coupled to the node N1R and the voltage such as Vee or Vdd in FIG. 3A, the switching device SWR2 is coupled between the node N1R and output of the analog buffer 18R. In this embodiment of the invention, the voltage Vee can be an appropriate voltage near to ground voltage, the voltage Vdd can be an appropriate voltage near to power voltage, such as Vdd and Vee shown in FIG. 3A for example. The switching device SWR3 is coupled between the DAC 14R and the load 17R, and the analog buffer 18R is coupled between the switching device SWR2 and output of the DAC 14R. The analog buffer 18R generates an analog voltage VAR2 according to the analog voltage VAR1, to increase the driving capability of the DAC 14R when the switching SWR2 is turned on.

The output circuit 16G comprises three switching devices SWG1~SWG3, and an analog buffer 18G. The switching device SWG1 is coupled to the node N1G and the voltage (Vee/Vdd), the switching device SWG2 is coupled between the node N1G and output of the analog buffer 18G. The switching device SWG3 is coupled between the DAC 14G and the load 17G, and the analog buffer 18G is coupled between the switching device SWG2 and output of the DAC 14G. The analog buffer 18G generates an analog voltage VAG2 according to the analog voltage VAG1, to increase the driving capability of the DAC 14G when the switching SWG2 is turned on.

The output circuit 16B comprises three switching devices SWB1~SWB3, and an analog buffer 18B. The switching device SWG1 is coupled to the node N1B and the voltage (Vee/Vdd), the switching device SWB2 is coupled between the node N1B and output of the analog buffer 18B. The switching device SWB3 is coupled between the DAC 14B and the load 17B, and the analog buffer 18B is coupled between the switching device SWB2 and output of the DAC 14B. The analog buffer 18B generates an analog voltage VAB2 according to the analog voltage VAB1, to increase the driving capability of the DAC 14B when the switching SWB2 is turned on.

The controller 50 controls the switching of the various switches. The controller 50 may be part of, or the switch control signal CS1 may be provided by, the timing controller 510 found in the electronics device (see FIG. 7). In the embodiment, the switching device SWR1, SWG1 and SWB1 are optional and can be omitted based on the corresponding analog buffers 18R, 18G and 18B.

Figure 2:
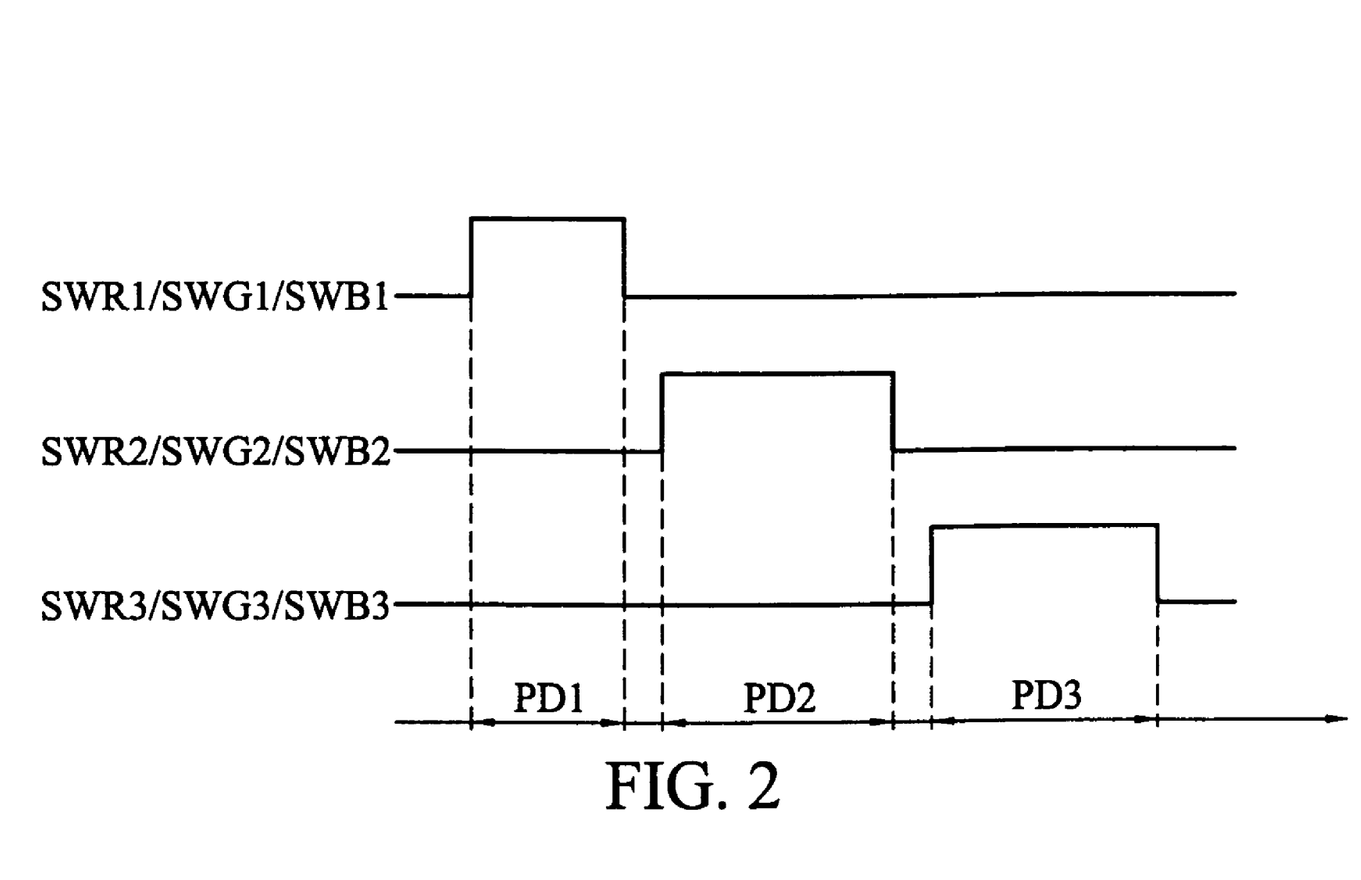
FIG. 2 is a timing chart of the signal driving circuit according to the embodiment.

FIG. 2 is a timing chart of the signal driving circuits 300A and 300B according to the embodiment. In the time intervals, the various switches are controlled by the controller 50 to function as follows.

During time interval PD1, all switches are turned off, except switching devices SWR1, SWG1 and SWB1, which are turned on such that voltages at nodes N1R, R1G and N1B from a preceding cycle are discharged to the voltage Vee or precharged to the voltage Vdd. In the embodiment, the time interval PD1 is optional and can be omitted based on the corresponding analog buffers 18R, 18G and 18B.

During time interval PD2, all switches are turned off, except that switching devices SWR2, SWG2 and SWB2, which are turned on such that the analog buffers 18R, 18G and 18B are coupled between the corresponding DACs 14R, 14G and 14B and the corresponding loads 17R, 17G and 17B respectively to increase driving capability of the DACs 14R, 14G and 14B. At the same time, the analog buffers 18R, 18G and 18B generate the analog voltages VAR2, VAG2 and VAB2 to the loads 17R, 17G and 17B respectively according to the voltages VAR1, VAG1 and VAB1 from the DACs 14R, 14G and 14B. In this embodiment, the voltages VAR2, VAG2 and VAB2 generated by the analog buffers 18R, 18G and 18B are essentially equal to the voltages VAR1, VAG1 and VAB1 from the DACs 14R, 14G and 14B respectively.

During time interval PD3, all switches are turned off, except that switching devices SWR3, SWG3 and SWB3 are turned on such that the voltages VAR1, VAG1 and VAB1 from the DACs 14R, 14G and 14B are output to the loads 17R, 17G and 17B respectively without DC offset voltage caused by analog buffers, thereby increasing precision of analog output voltage level.

Figure 1B:
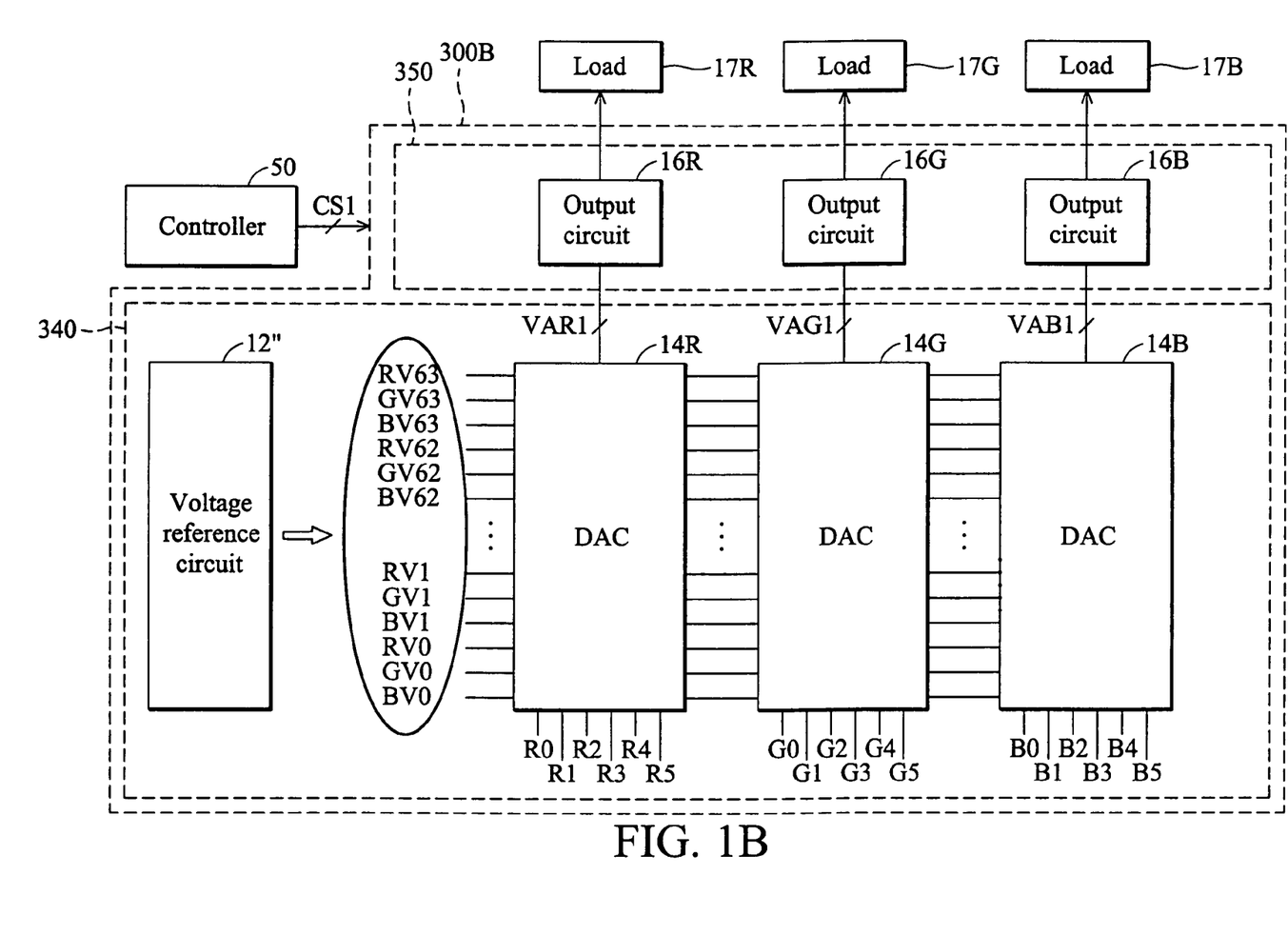
FIG. 1B shows another aspect of the embodiment of a signal driving circuit.

FIG. 1B shows a variation of the embodiment of a signal driving circuit. The signal driving circuit 300B shown in FIG. 1B is similar to the circuit 300A in FIG. 1A, except for voltage reference circuit 12".

As shown in FIG. 1B, unlike the voltage reference circuit 12 in the driving circuit 300A, the voltage reference circuit 12" provides reference voltages RV0~RV63, GV0~GV63 and BV0~BV63 to the DACs 14R, 14G and 14B respectively. The DAC 14R is coupled to the reference voltage levels VR0~VR63 and digital data R0~R5 and generates an analog voltage VAR1 to the output circuit 16R according thereto. The DAC 14G is coupled to the reference voltage levels GV0~GV63 and digital data G0~G5 and generates an analog voltage VAG1 to the output circuit 16G according thereto. The DAC 14B is coupled to the reference voltage levels BV0~BV63 and digital data B0~B5 and generates an analog voltage VAB1 to the output circuit 16B according thereto. Namely, the DACs 14R, 14G and 14B generate the analog voltages VAR1, VAG1 and VAB1 according to different sets of reference voltages, for gamma correction.

The signal driving circuit 300B can be a portion of a source driver or a data driver in an OLED display system, and the voltage reference circuit 12" can be three resistor strings (R-strings). Operations of the output circuits 16R~16B shown in FIG. 1B are similar to those shown in FIG. 1A, and thus are omitted for simplification.

Figure 3A:
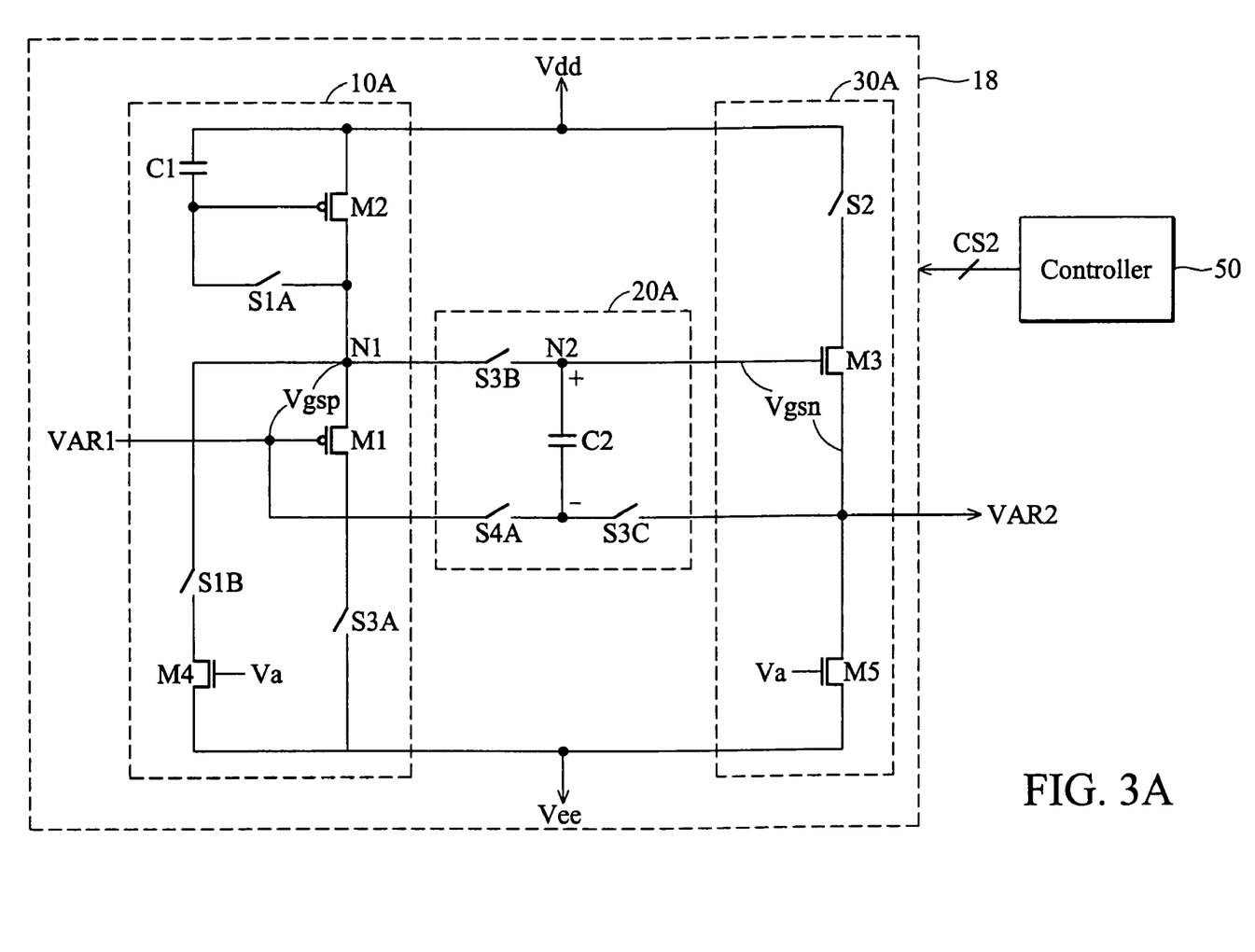
FIG. 3A shows an embodiment of an analog buffer in accordance with one embodiment of the present invention.

FIG. 3A shows an embodiment of an analog buffer in accordance with one aspect of the present invention. The analog buffer 18 comprises a first source follower 10A, a switching circuit 20A, and a second source follower 30A.

As shown in FIG. 3A, the first source follower 10A is a P-type source follower coupled between power voltages Vdd and Vee. The first source follower 10A comprises two transistors M1 and M2, three switching devices S1A, S1B and S3A, a capacitor C1, and a transistor biased by a bias voltage Va. The switching circuit 20A is coupled between the first and second source followers 10A and 30A. The switching circuit 20A comprises three switching devices S3B, S3C and S4A, and a capacitor C2. The second source follower 30A is an N-type source follower, coupled to the switching circuit 20A. The second source follower 30A comprises a transistor M3, a switching device S2, and a transistor M5 biased by the bias voltage Va. In this embodiment, the current provided by the transistor MS can be N times that provided by the transistor M4, increasing driving capability. The controller 50 also controls switching of the various switches. The controller 50 may be part of, or the switch control signals CS2 may be provided by, the timing controller 510 found in the electronic device (see FIG. 7).

Figure 4:
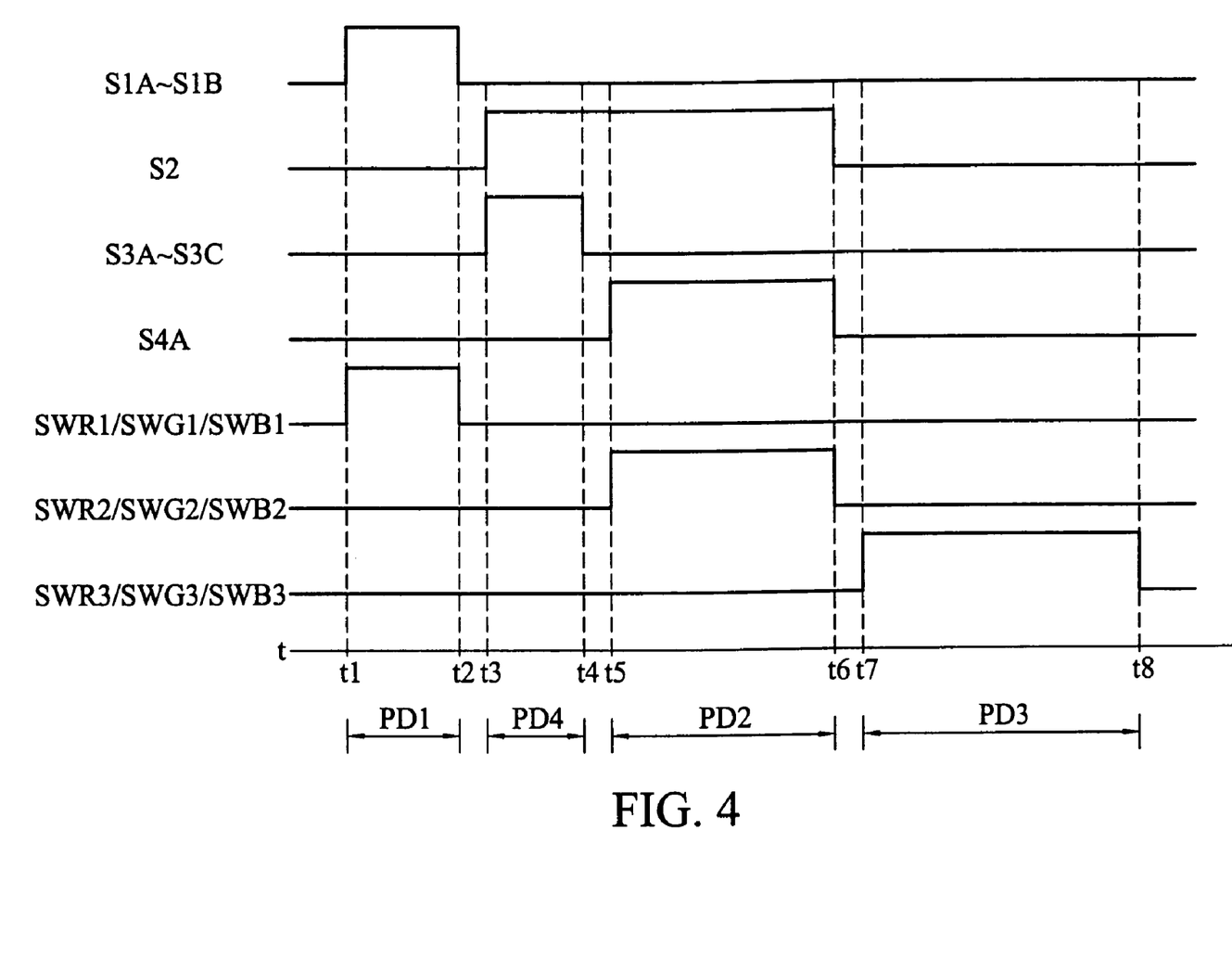
FIG. 4 shows the timing chart of the embodiment of the signal driving circuit with analog buffers illustrated in FIGS. 3A and 3B above.

FIG. 4 is a timing chart of the signal driving circuit 300A employing the analog buffers 18 as shown in FIG. 3A. Referring to FIGS. 1A and 3A, the various switches are controlled by the controller 50 to function as follows.

During time interval t1–t2 (PD1), all switches are turned off, except that switching devices SWR1, SWG1 and SWB1 in output circuits 16R, 16G and 16B shown in FIG. 1A and the switching device S1A and S1B in each analog buffer 18R, 18G and 18B shown in FIG. 3A are turned on. Due to turning on of the switching devices SWR1, SWG1 and SWB1, voltages at the nodes N1R, N1G and N1B from a preceding cycle are discharged to the power voltage Vee. Further, because the switching devices S1A and S1B in each analog buffer 18R, 18G and 18B are turned on, a voltage is stored in the capacitor C1 to turn on the transistor M2.

During time interval t2–t3, the switching devices SWR1, SWG1 and SWB1 in output circuits 16R, 16G and 16B and the switching devices S1A and S1B are turned off. The transistor M2 remains on due to the voltage stored in the capacitor C1.

time interval t3–t4 (PD4), the switching devices S2, S3A, S3B and S3C in each analog buffer are turned on such that the first and second source followers 10A and 30A are both enabled. Accordingly, the first source follower 10A regulates a voltage of VAR1+|Vgsp| at the node N1 in the analog buffer 18R. The node N2 is then charged to the voltage of VAR1+|Vgsp| a voltage of |Vgsn| is stored in the capacitor C2. Similarly, the first source follower 10A regulates a voltage of VAG1+|Vgsp| at the node N1 in the analog buffer 18G. The node N2 is then charged to the voltage of VAG1+|Vgsp|, a voltage of |Vgsn| is stored in the capacitor C2. Similarly, the first source follower 10A regulates a voltage of VAB1+|Vgsp| at the node N1 in the analog buffer 18B. The node N2 is then charged to the voltage of VAB1+|Vgsp|, a voltage of |Vgsn| is stored in the capacitor C2. In this embodiment, the $V_{gs}$ of the transistors M1 and M3 are normalized by adjusting M1 and M3 size, namely |Vgsp|=|Vgsn|.

time interval t4–t5, the switching devices S3A, S3B and S3C in each analog buffer are turned off such that the first source follower 10A is disabled to conserve power.

time interval t5–t6 (PD2), the switching device S4A is turned on such that the second source follower 30A in the analog buffer 18R outputs a voltage VAR2 identical to the input voltage VAR1 according to the input voltage from the switching devices S4A and the voltage (|Vgsn|) stored capacitor C2. The output voltage VAR2 regulated by the transistor M3 is identical to the input voltage VAR1 because the |Vgsn| of the transistor M3 is compensated by voltage stored in the capacitor C2. Similarly, the second source follower 30A in the analog buffer 18G also outputs a voltage VAG2 identical to the voltage VAG1, and the second source follower 30A in the analog buffer 18B also outputs a voltage VAB2 identical to the voltage VAB1. In the same time interval, the switching devices SWR2, SWG2 and SWB2 are turned on such that the voltages VAR2, VAG2 and VAB2 are output to the loads 17R, 17G and 17B respectively.

During time interval t6–t7, the switching devices S2 and S4A are turned off such that the second source follower 30A in each analog buffer 18R, 18G and 18B is disabled to conserve power.

During time interval t7–t8 (PD3), all switches are turned off, except that the switching devices SWR3, SWG3 and SWB3 in output circuits 16R, 16G and 16B shown in FIG. 1A such that the voltages VAR1, VAG1 and VAB1 from the DACs 14R, 14G and 14B are output to the loads 17R, 17G and 17B respectively without DC offset voltage caused by analog buffers, thereby increasing precision of analog output voltage level. The cycle above repeats from t1 to t8, in accordance with the timing chart of FIG. 4.

Figure 3B:
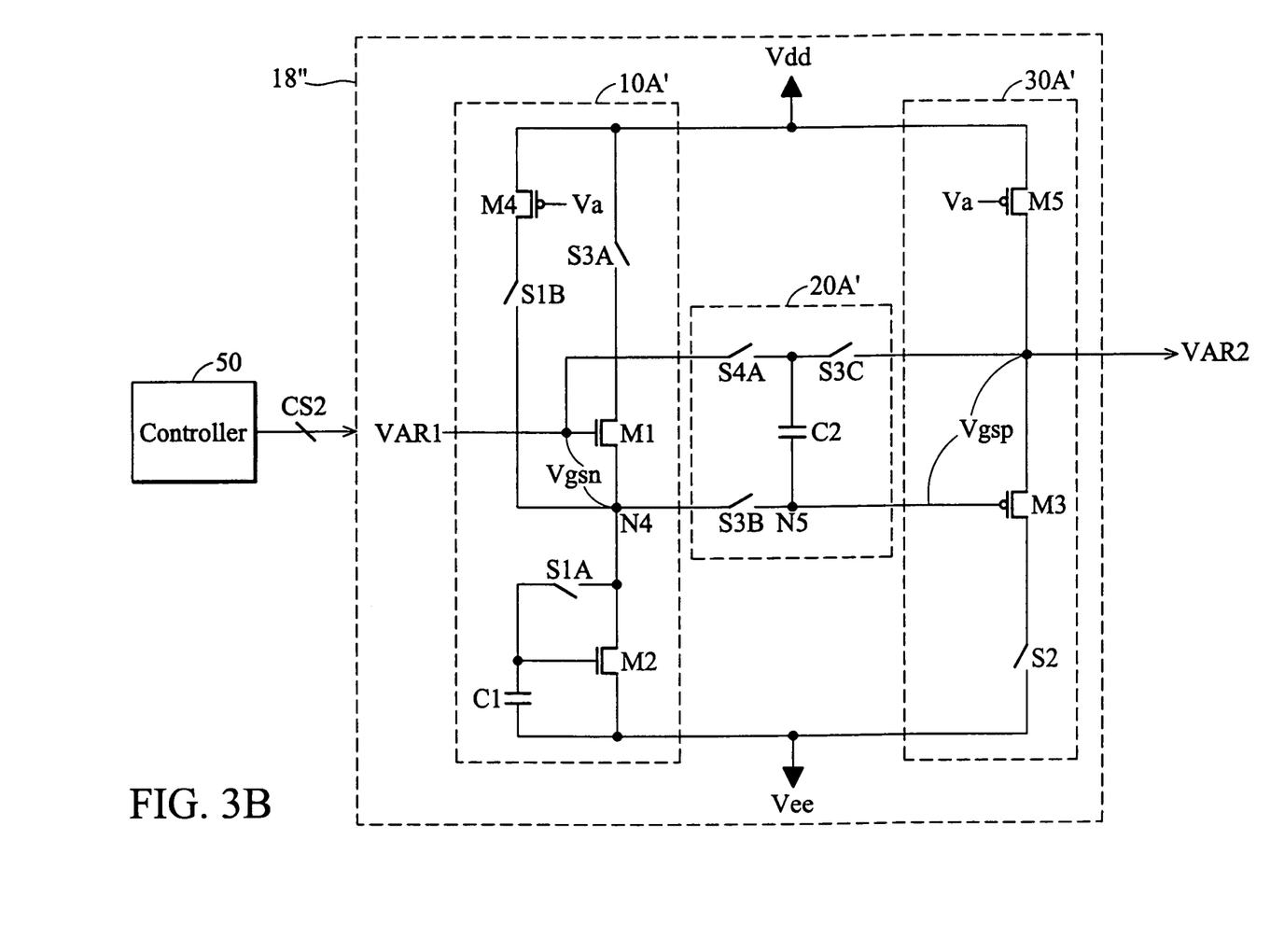
FIG. 3B shows another embodiment of an analog buffer.

FIG. 3B shows another embodiment of an analog buffer. The analog buffer 18″ comprises a first source follower 10A′, a switching circuit 20A′, and a second source follower 30A′. As shown in FIG. 3B, unlike the previous embodiment, the first source follower 10A′ is an N-type source follower coupled between the power voltages Vdd and Vee. The second source follower 30A′ is a P-type source follower, coupled to the switching circuit 20A′.

The first source follower 10A′ comprises two transistors M1 and M2, three switching devices S1A, S1B and S3A, a capacitor C1, and a transistor M4 biased by a bias voltage Va. The switching circuit 20A′ is coupled between the first and second source followers b1A′ and 30A′. The switching circuit 20 comprises three switching devices S3B, S3C and S4A and a capacitor C2. The second source follower 30A′ is a P-type source follower, coupled to the switching circuit 20A′. The second source follower 30A′ comprises a transistor M3, a switching device S2, and a transistor M5 biased by the bias voltage Va. In this embodiment, the current provided by the transistor M5 can be N times that provided by the transistor M4, for increased driving capability.

FIG. 4 is also the timing chart of the signal driving circuit 300A employing three analog buffers 18″ as shown in FIG. 3B.

During time interval t1–t2, all switching devices are turned off, expect that the switching devices SWR1, SWG1 and SWB1 in output circuits 16R, 16G and 16B shown in FIG. 1A, and the switching devices S1B and S1B in each analog buffer 18R, 18G and 18B shown in FIG. 3B. Due to turning on of the switching devices SWR1, SWG1 and SWB1, the voltages at the nodes N1R, N1G and N1B from a preceding cycle are charged to the power voltage Vdd. Further, because the switching devices S1A and S1B in each analog buffer 18R, 18G and 18B are turned on, a voltage is stored in the capacitor C1 to turn on the transistor M2.

time interval t2–t3, the switching devices SWR1, SWG1 and SWB1 in output circuits 16R, 16G and 16B and the switching devices S1A and S1B are turned off. The transistor M2 remains on due to the voltage stored in the capacitor C1.

time interval t3–t4 (PD4), the switching devices S2, S3A, S3B and S3C in each analog buffer are turned on such that the first and second source followers 10A′ and 30A′ are both enabled. Accordingly, the first source follower 10A′ regulates a voltage of VAR1−|Vgsn| at the node N4. The node N5 is then charged to the voltage of VAR1−|Vgsn| due to turning on of the switching device S3B, and a voltage of |Vgsp| is stored in the capacitor C2. Similarly, the first source follower 10A′ regulates a voltage of VAG1−|Vgsn| at the node N4 in the analog buffer 18G. The node N5 is then charged to the voltage of VAG1−|Vgsn|, a voltage of |Vgsp| is stored in the capacitor C2. Similarly, the first source follower 10A regulates a voltage of VAB1−|Vgsn| at the node N4 in the analog buffer 18B. The node N5 is then charged to the voltage of VAB1−|Vgsn|, a voltage of |Vgsp| is stored in the capacitor C2. In this embodiment, the $V_{gs}$ of the transistors M1 and M3 are normalized by adjusting M1 and M3 size, namely |Vgsp|=|Vgsn|.

time interval t4–t5, the switching devices S3A, S3B and S3C are turned off in each analog buffer such that the first source follower 10A′ is disabled to conserve power.

time interval t5–t6 (PD2), the switching devices S4A and S4B are turned on such that the second source follower 30A′ in analog buffer 18R outputs a voltage VAR2 identical to the input voltage VAR1 according to the input voltage from the switching devices S4A and the voltage stored capacitor C2. The output voltage VAR2 regulated by the transistor M3 is identical to the input voltage VAR1 because the |Vgsp| of the transistor M3 can be compensated by voltage stored in the capacitor C2. Similarly, the second source follower 30A′ in the analog buffer 18G also outputs a voltage VAG2 identical to the voltage VAG1, and the second source follower 30A′ in the analog buffer 18B also outputs a voltage VAB2 identical to the voltage VAB1. In the same time interval, the switching devices SWR2, SWG2 and SWB2 are turned on such that the voltages VAR2, VAG2 and VAB2 are output to the loads 17R, 17G and 17B respectively.

time interval t6–t7, the switching devices S2 and S4A are turned off such that the second source follower 30A′ in each analog buffer is disabled to conserve power.

During time interval t7–t8 (PD3), all switches are turned off, except that the switching devices SWR3, SWG3 and SWB3 in output circuits 16R, 16G and 16B shown in FIG.

1A such that the voltages VAR1, VAG1 and VAB1 from the DACs 14R, 14G and 14B are output to the loads 17R, 17G and 17B respectively without DC offset voltage from analog buffers, thereby increasing precision of analog output voltage level.

Figure 5A:
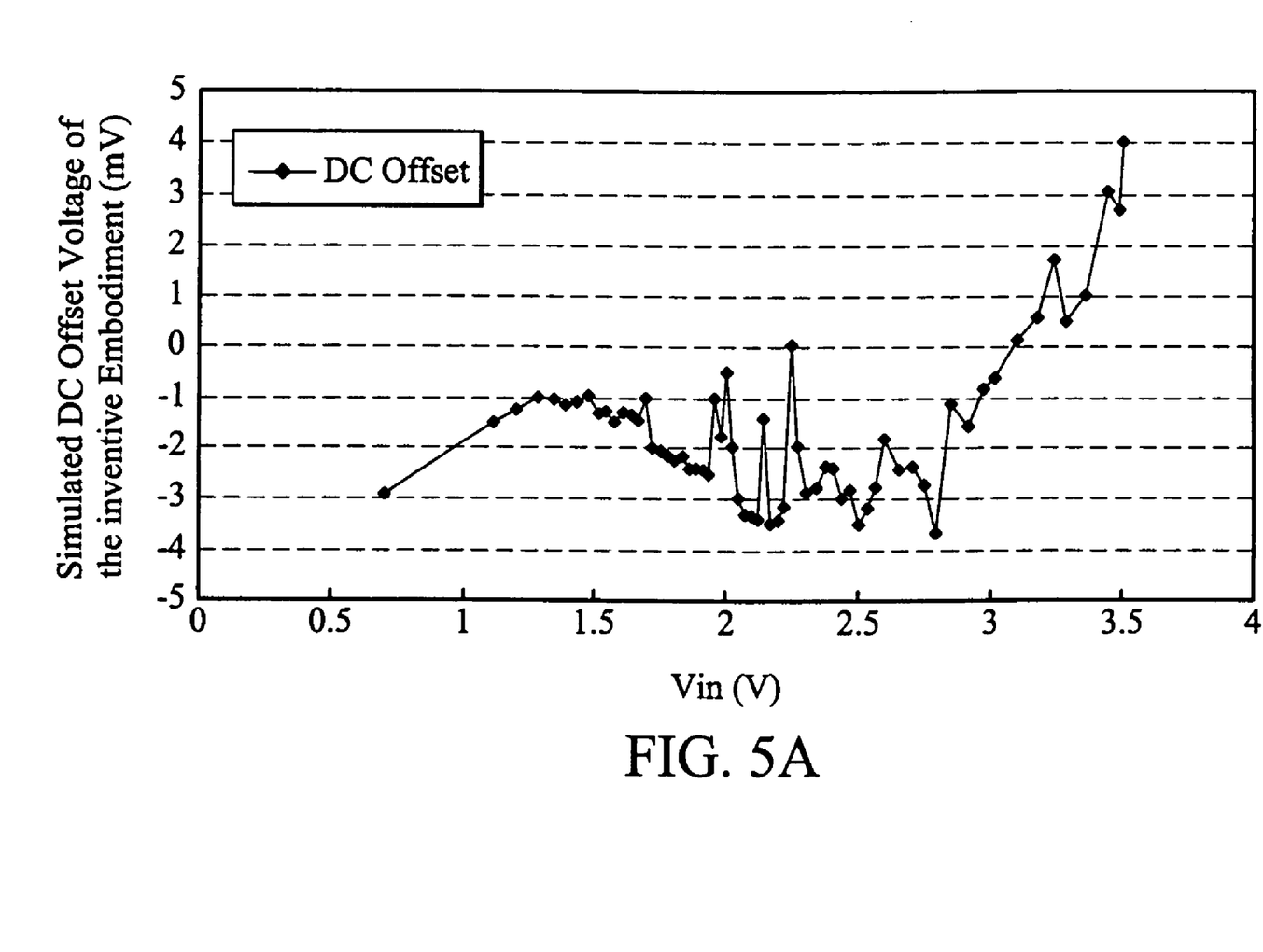
FIG. 5A and FIG. 5B show the relationship between the input voltage of the output circuit and DC offset voltage during different time intervals according to simulation of the embodiments.

FIG. 5A shows the relationship between the input voltage Vin of the output circuit and DC offset voltage after turning on the switching devices SWR2, SWG2 and SWB2 according to simulation of the embodiments of FIGS. 3A and 3B.

During this period (PD2), the signal driving circuit utilizes analog buffers to output analog voltages to the corresponding loads, improving the driving capability of the DACs under a small DC offset voltage. As shown in FIG. 5A, the DC offset voltage of the analog buffers of the embodiments is less than 10 mV, in which the input voltage Vin of output circuit is the output voltage VAR1, VAG1 or VAB1 of the DACs 14R, 14G or 14B.

Figure 5B:
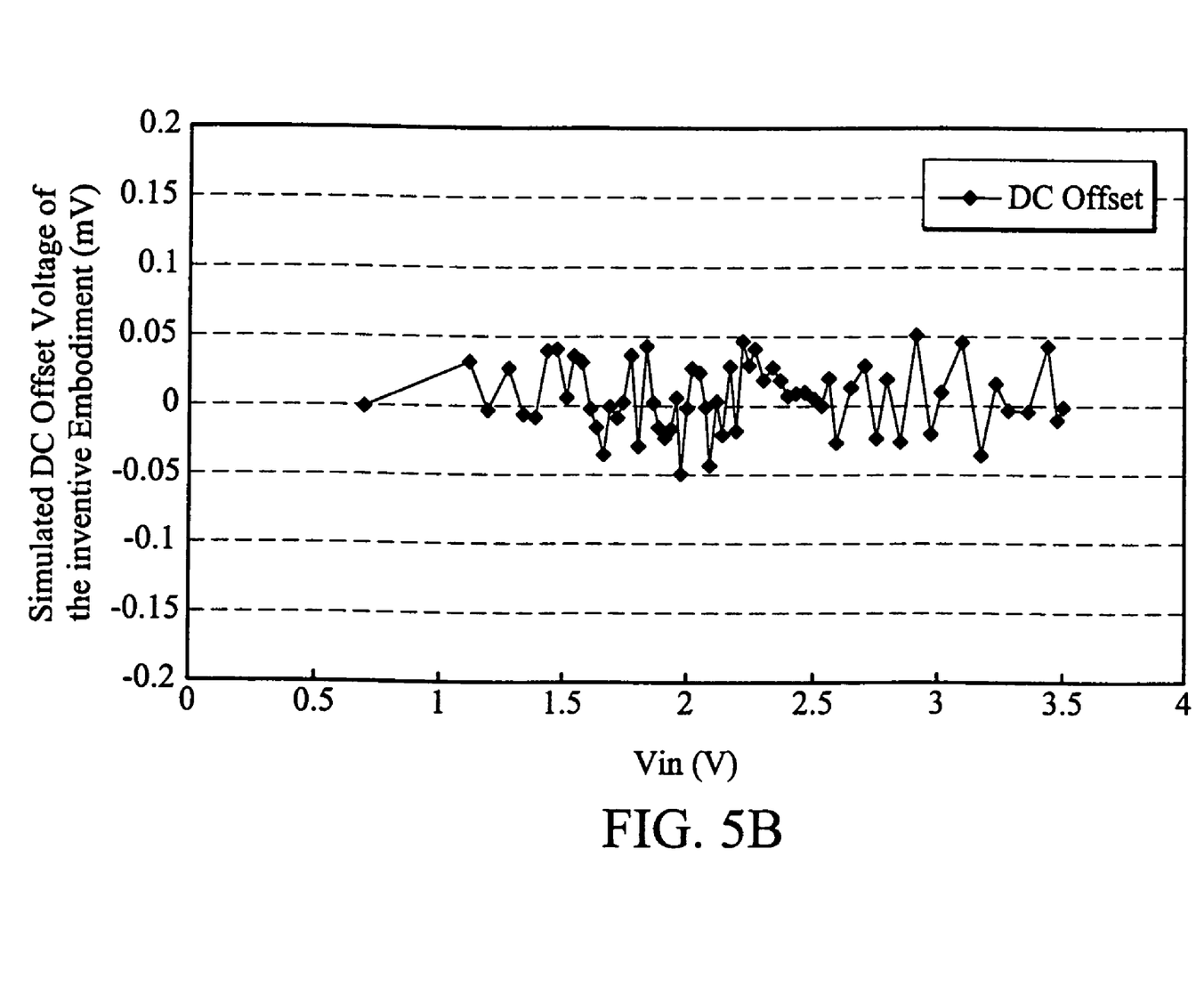

FIG. 5B shows the relationship between the input voltage Vin and DC offset voltage after turning on the switching devices SWR3, SWG3 and SWB3 according to simulation of the embodiments of FIGS. 3A and 3B. In this period (PD3), the signal driving circuit directly outputs analog voltages from DACs to the corresponding loads without DC offset voltage from analog buffers, thereby increasing precision of analog output voltage level. As shown in FIG. 5B, the DC offset voltage of output circuit of the embodiments is less than 0.1 mV, wherein the input voltage Vin is the output voltage VAR1, VAG1 or VAB1 of the DACs 14R, 14G or 14B.

Because the signal driving circuit of the embodiments of the invention outputs analog voltages through analog buffers and directly from the DACs to the corresponding loads in turn, they improve the driving capability and precision of analog output voltage level at the same time.

Figure 6:
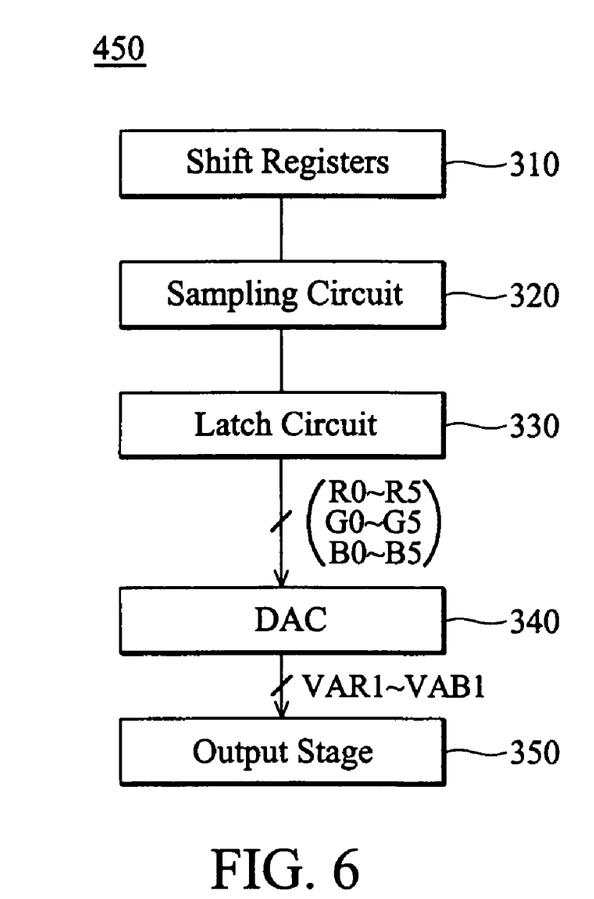
FIG. 6 is a schematic diagram of a signal driving circuit according to one embodiment of the invention.

FIG. 6 is a schematic diagram of a driver 450 according to various embodiments of the invention. As shown in FIG. 6, the driver 450 can comprise shift registers 310, a sampling circuit 320, a latching circuit 330, the digital-to-analog conversion circuit 340 comprising a plurality of digital-to-analog converters 14 as shown in FIG. 1A or 1B, and the output stage 350 comprising a plurality of output circuits 16 as shown in FIG. 1A or 1B. The shift registers 310 have a plurality of stages equal in number to columns of pixels in a display panel (not shown). The sampling circuit 320 samples data on a data bus (not shown) synchronous with sampling pulses output successively from the shift registers 310. The latch circuit 330 holds and latches the sampled data during a horizontal period, and the DAC 340 converts the latched data to analog signals. The output stage 350 drives the columns of pixels in a display panel according to the analog signals from the digital-to-analog conversion circuit 340 and control signals from external controller. The driver 450 can be a source driver or a data driver in a display system, such as a liquid crystal display system or the like.

Figure 7:
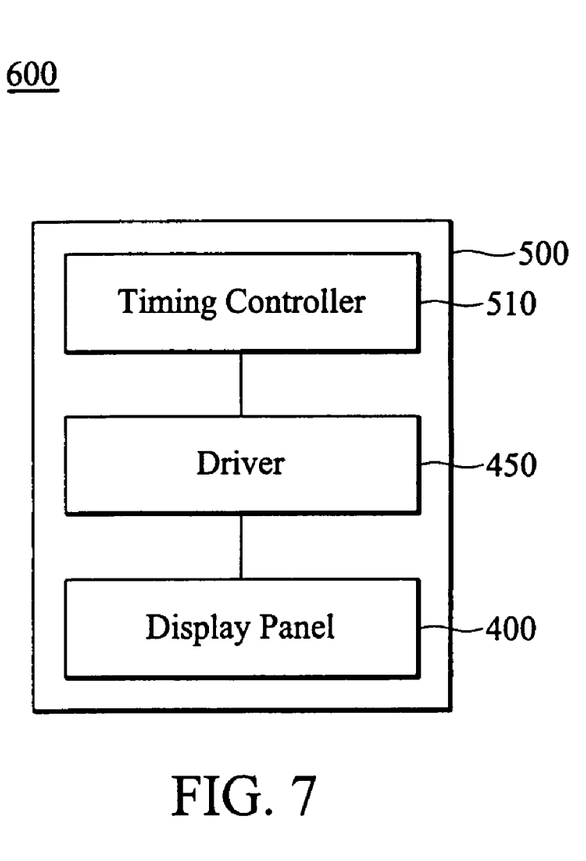
FIG. 7 schematically shows an electronic device deploying a driving circuit shown in FIG. 6.

FIG. 7 schematically shows an electronic device 600 deploying a driving circuit 300 described above. The display panel 400 can be a liquid crystal display element, a plasma display element, an organic light emitting display element, or a cathode ray tube element. The electronic device 600 may be a portable device such as a PDA, notebook computer, tablet computer, cellular phone, or a display monitor device, etc. Generally, the electronic device 600 includes a housing 500, a timing controller 510, the display panel 400 and a driving circuit 300, etc. Further, the timing controller 510 is operatively coupled to the signal driving circuit and provides control signals to the driving circuit 300. The driving circuit 300 is operatively coupled to the display panel 400 and provides analog voltage to drive the display panel 400, and the display panel 400 displays images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal driving circuit, comprising:
   a digital-to-analog converter (DAC), generating a first analog voltage according to a digital data; and
   an output circuit, outputting a second analog voltage according to the first analog voltage by an analog buffer to a load in a first period and the first analog voltage to the load without passing through the analog buffer in a second period, wherein the first period is prior to the second period.

2. The signal driving circuit as claimed in claim 1, wherein the analog buffer is disposed in the output circuit, and is coupled to the DAC.

3. The signal driving circuit as claimed in claim 2, wherein the output circuit further comprises:
   a first path switching device coupled between the DAC and the load; and
   a second path switching device coupled between the analog buffer and the load.

4. The signal driving circuit as claimed in claim 3, wherein the first path switching device and the second path switching device are turned on in the second period and the first period respectively.

5. The signal driving circuit as claimed in claim 3, wherein the output circuit further comprises a pre-charge/discharge circuit coupled between the analog buffer and the load for pre-charge/discharge during a third period prior to the first period.

6. The signal driving circuit as claimed in claim 1, wherein the analog buffer comprises:
   a first source follower, regulating a first voltage according to the first analog voltage during a fourth period;
   a switching circuit coupled to the first source follower, regulating a second voltage essentially equal to the first voltage, according to the first analog voltage, during the first period; and
   a second source follower coupled to the switching circuit, receiving the first voltage and the second voltage during the fourth period and the first period respectively, and outputting the second analog voltage to the load according to the second voltage during the first period, wherein the fourth period is prior to the first period.

7. The signal driving circuit as claimed in claim 6, wherein the first source follower is an N-type source follower and the second source follower is a P-type source follower.

8. The signal driving circuit as claimed in claim 6, wherein the first source follower is a P-type source follower and the second source follower is an N-type source follower.

9. The signal driving circuit as claimed in claim 6, wherein the first source follower is turned off and the second source follower turned on during the first period.

10. The signal driving circuit as claimed in claim 6, wherein the first source follower and the second source follower are turned on to store a compensation voltage in the switching circuit during the fourth period.

11. The signal driving circuit as claimed in claim 6, wherein the switching circuit regulates the second voltage according to the first analog voltage and the stored compensation voltage during the first period.

12. An electronic device, comprising:
a signal driving circuit as claimed in claim 1; and
a display element coupled to the signal driving circuit, wherein the display element is driven by the signal driving circuit.

13. The electronic device as claimed in claim 12, wherein the display element comprises a liquid crystal display element, a plasma display element, an organic light emitting display element, or a cathode ray tube element.

14. The electronic device as claimed in claim 12, wherein the electronic device comprises a PDA, a display monitor, a notebook computer, a tablet computer, or a cellular phone.

15. A signal driving circuit, comprising:
a first digital-to-analog converter (DAC), generating a first analog voltage according to a first digital data and a first set of reference voltage levels;
a first output circuit, outputting a second analog voltage by a first analog buffer according to the first analog voltage to a first load in a first period and the first analog voltage to the first load without passing through the first analog buffer in a second period;
a second DAC, generating a third analog voltage according to a second digital data and a second set of the reference voltage levels; and
a second output circuit, outputting a fourth analog voltage by a second analog buffer according to the third analog voltage to a second load in the first period and the third analog voltage to the second load without passing through the second analog buffer in the second period, wherein the first period is prior to the second period.

16. The signal driving circuit as claimed in claim 15, wherein the first analog buffer is disposed in the first output circuit and is coupled to the first DAC, and the second analog buffer is disposed in the second output circuit and is coupled to the second DAC.

17. The signal driving circuit as claimed in claim 16, wherein the first output circuit further comprises a first path switching device coupled between output of the first DAC and the first load and a second path switching device coupled between output of the first analog buffer and the first load, and the second output circuit further comprises a third path switching device coupled between output of the second DAC and the second load and a fourth path switching device coupled between output of the second analog buffer and the second load.

18. The signal driving circuit as claimed in claim 17, wherein the first and third path switching devices are turned on during the second period, and the second and fourth path switching devices are turned on during the first period.

19. The signal driving circuit as claimed in claim 17, wherein the first output circuit further comprises a first pre-charge/discharge circuit coupled between the first analog buffer and the first load for pre-charge/discharge in during third period prior to the first period, and the second output circuit further comprises a second pre-charge/discharge circuit coupled between the second analog buffer and the second load for pre-charge/discharge during the third period.

20. A method of outputting a driving voltage in a signal driving circuit, comprising the steps of:
generating a first analog voltage according to digital data;
generating a second analog voltage by an analog buffer according to the first analog voltage; and
outputting the first analog voltage in a first period and the second analog voltage in a second period, serving as the driving voltage to output to the load, wherein the first period is prior to the second period.

* * * * *